(12) United States Patent
Berner et al.

(10) Patent No.: US 6,967,670 B2
(45) Date of Patent: Nov. 22, 2005

(54) DEVICE, METHOD AND COMPUTER PROGRAM FOR TRANSMITTING DATA

(75) Inventors: Peter Berner, Rupperswil (CH); Roy Darrall, Gloucestershire (GB)

(73) Assignees: Ursula Luscher, Meisterschwanden (CH); Hans Luscher, Lenzburg (CH)

( * ) Notice: Subject to any disclaimer, the term of this patent is extended or adjusted under 35 U.S.C. 154(b) by 0 days.

(21) Appl. No.: 10/294,894

(22) Filed: Nov. 15, 2002

(65) Prior Publication Data

US 2003/0137551 A1 Jul. 24, 2003

Related U.S. Application Data

(63) Continuation of application No. PCT/CH01/00296, filed on May 14, 2001.

(30) Foreign Application Priority Data

May 15, 2000 (CH) .............................................. 0956/00

(51) Int. Cl.[7] .............................................. B41J 3/407
(52) U.S. Cl. ...................................................... 347/233
(58) Field of Search .............................. 347/233, 238, 347/2, 224; 369/275.1, 103; 386/124, 126; 358/1.11, 1.18, 1.16

(56) References Cited

U.S. PATENT DOCUMENTS

| | | | |
|---|---|---|---|
| 4,967,286 A | 10/1990 | Nomula et al. | |
| 5,737,306 A | 4/1998 | Ito et al. | |
| 2001/0035886 A1 * | 11/2001 | Bradshaw et al. | ............. 347/2 |

FOREIGN PATENT DOCUMENTS

WO   WO 99/46769   9/1999

* cited by examiner

Primary Examiner—Huan Tran
(74) Attorney, Agent, or Firm—Venable LLP; Stuart I. Smith

(57) ABSTRACT

The invention relates to a device, a method and a corresponding computer program product for transmitting data to a carrier. The device (1) comprises a control system (2), a holding surface (3) which is used to hold the carrier (4) and a transmission head (5) for transmitting data from a data memory (6) to said carrier (4). The holding surface (3) is arranged in such a way that it can be rotated about an x-axis (8) by means of a first drive device (7) and the transmission head (5) is arranged in such a way that it can be moved along a y-axis (10) by means of a second drive device (9). Both the holding surface and the transmission surface are controlled by the control system (2) in a coordinated manner. The invention is characterized in that the device (1) comprises an additional computer (16) in which a computer program product can be installed, said computer program product comprising software code segments with which, when this computer program product is running on said additional computer (16) and by means of generating polar co-ordinates, data is read out of, in a circular manner, a linear file read into or stored in the working memory (RAM) of the computer (16). The data determined in this way is allocated via the memory store (6) to the transmission head (5) for transmission to the carrier (4).

5 Claims, 3 Drawing Sheets

DEVICE, METHOD AND COMPUTER PROGRAM FOR TRANSMITTING DATA

RELATED DOCUMENTS

Figure 1:
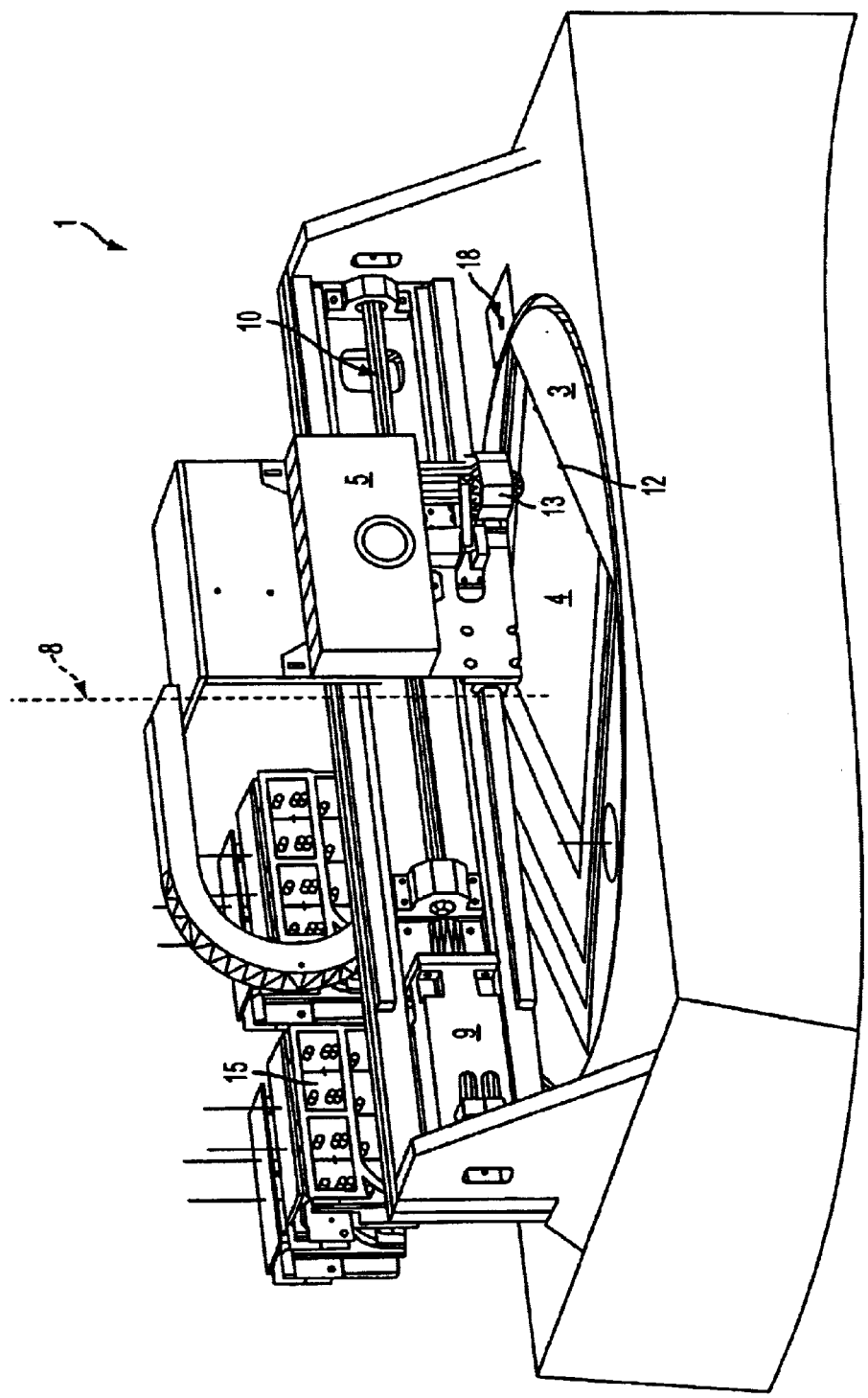

This patent application is a continuation application of the International Patent Application PCT/CH01/00296 filed May 14, 2001, for which International Patent Application the USPTO is elected and which is pending in the US and which International Patent Application is fully incorporated by reference, hereby.

TECHNICAL FIELD

The invention relates, according to a first aspect, to a device of the type serving for transmitting data to a carrier. More particular, the invention is related to a device for transmitting data to a carrier, wherein the device comprises a control system, a holding surface for holding the carrier and a transmission head for transmitting data to this carrier from a data memory, wherein the holding surface is rotatable about a X-axis. According to a second and a third aspect, the invention also relates to a corresponding computer program and a corresponding method, respectively.

BACKGROUND OF THE INVENTION

The primary field of application of the invention is the printing industry, in which the transmission of data to data carriers, in particular, the exposure of information carriers such as offset printing plates, lithography films or setting copies for flexographic printing processes, represents a very important process step. Since the source data used for the printing process are more and more frequently stored on a computer and then transmitted from this computer to the setting copy or a data carrier, this technology is referred to as the "Computer-to-Plate" (CtP) technology.

CtP devices known from the state of the art utilize data transmission principles, in which a flatbed or a drum is provided as the holding surface for the data carrier. The transmission head for transmitting the data and the data carrier that receives the data are always moved relative to one another in such a way that data can be transmitted over the largest portion of the data carrier surface possible.

It is known that flatbed systems operate relatively slow. Exposure systems that operate in accordance with the capstan principle transmit data with a single laser beam. In this case, each round exposure point becomes elliptical at a high deviation such that the resolution is limited depending on the distance from the central axis. Systems that operate with a X/Y coordinate table tend to form exposure strips that can only be prevented with complicated and costly machines. Although the utilization of multiple exposure heads with a series of laser diodes makes it possible to shorten the exposure times, it is very difficult to prevent this strip formation that is also referred to as "digital-optical banding."

Interior drum systems, in which a laser beam is deviated by means of a mirror in such a way that it can sweep over the data carrier, require the utilization of particularly expensive and high-power YAG lasers, the focusing of which is relatively complicated because the lens system is situated far from the data carrier. The polygon mirror used needs to revolve with high speeds (approximately 20,000–30,000 rpm). This requires a complicated and expensive bearing arrangement for the mirror, wherein vibration-free guides and special foundations are also absolutely imperative.

An exterior drum system makes it possible to move the transmission head toward the plate surface until they are spaced apart by only a few millimeters. This allows the utilization of inexpensive laser diodes that can also be easily focused and utilized as multi-channel exposure heads. However, the installation of the data carrier on the outside of the drum is complicated with respect to constructive considerations and the handling (placing the plates into the centering pins). Damages (bending) may occur when handling thin offset plates with a thickness of 0.15 mm. In addition, the drum needs to be balanced differently-depending on the size of the plates to be exposed. When using thermal plates, dust particles are created during the exposure, wherein said dust particles are directly thrown onto and soil the lens system due to the centrifugal force.

The combined interior/exterior drum system proposed by the applicant for the present invention combines the advantages of interior and exterior drum systems and eliminates the respectively cited disadvantages. However, the bending of the plate which occurs during their installation on the drums may cause certain disadvantages to persist: offset printing plates with a thickness of 0.15 mm make it possible to produce a very intimate contact with the inside of the drum, but are very sensitive to bending such that they must be handled very carefully. Offset plates with a thickness of 0.30 mm are less sensitive to bending, but relatively stiff in the marginal region. This means that the plates do not always produce an intimate contact with the drum up to the edge. This can negatively influence the focus during the exposure, as well as the suction vacuum. In addition, the manufacture of these devices is relatively complicated and expensive. One also has to take into account that up to a third of the exposure time may be lost because the interior of the drum is open at the top in order to install the plates.

SUMMARY OF THE INVENTION

The object of the invention is to propose an alternative device and an alternative method which—while maintaining the same quality—are based on a less expensive construction and allow a simple handling of plates.

According to a first aspect of the invention, this object is solved by a device for transmitting data to a carrier, wherein the device comprises a control system, a holding surface for holding the carrier and a transmission head for transmitting data to this carrier from a data memory, wherein the holding surface is rotatable about a X-axis by means of a first drive and the transmission head is displaceable along a Y-axis by means of a second drive, and wherein the movements of the holding surface and the transmission head are controlled in a coordinated fashion by the control system, characterized by the fact that the device is provided with an additional computer, on which a computer program can be installed, wherein the computer program comprises software code sections, by means of which data can when this computer program is running on the additional computer be read out in a circular fashion from a linear data file read into or stored in the working memory (RAM) of the computer, namely by generating polar coordinates, and by the fact that the thusly determined data are allocated to the transmission head by the data memory for the subsequent transmission to the carrier.

According to a second aspect, the object is solved by a computer program that is stored on a suitable storage medium and comprises program means that can be read by a computer and cause the computer to monitor the execution of the following application: loading a data file into the working memory (RAM) of the computer; reading out data in a circular fashion from a linear data file read into or stored in the working memory (RAM) of the computer by acquiring the data, generating polar coordinates and allocating the polar coordinates to the acquired data; allocating the thusly determined data to a data memory and consequently to a transmission head of a device for transmitting data to a carrier, wherein said device comprises a control system, a holding surface for holding the carrier and a transmission head for transmitting data to this carrier from the data memory, wherein the holding surface is rotatable about a X-axis by means of a first drive and the transmission head is displaceable along a Y-axis by means of a second drive, and wherein the movements of the holding surface and the transmission head are controlled in a coordinated fashion by the control system, and transmitting the data to the points of the carrier which correspond to the allocated polar coordinates.

According to a third aspect, the object is solved by a method for transmitting data to a carrier, wherein a device is used which comprises a control system, a holding surface for holding the carrier and a transmission head for transmitting data to this carrier from a data memory, wherein the holding surface is rotatable about a X-axis by means of a first drive and the transmission head is displaceable along a Y-axis by means of a second drive, and wherein the movements of the holding surface and the transmission head are controlled in a coordinated fashion by the control system, wherein a computer program is installed on an additional computer that is connected to the device, wherein the software code sections of this computer program cause the computer to read out data in a circular fashion from a linear data file read into or stored in the working memory (RAM) of the computer, namely by generating polar coordinates, and by the fact that the thusly determined data is allocated to the transmission head via the data memory for the subsequent transmission to the carrier.

Advantageous embodiments and additional characteristics are disclosed in the respective dependent claims.

BRIEF DISCUSSION OF THE DRAWINGS

Figure 2:
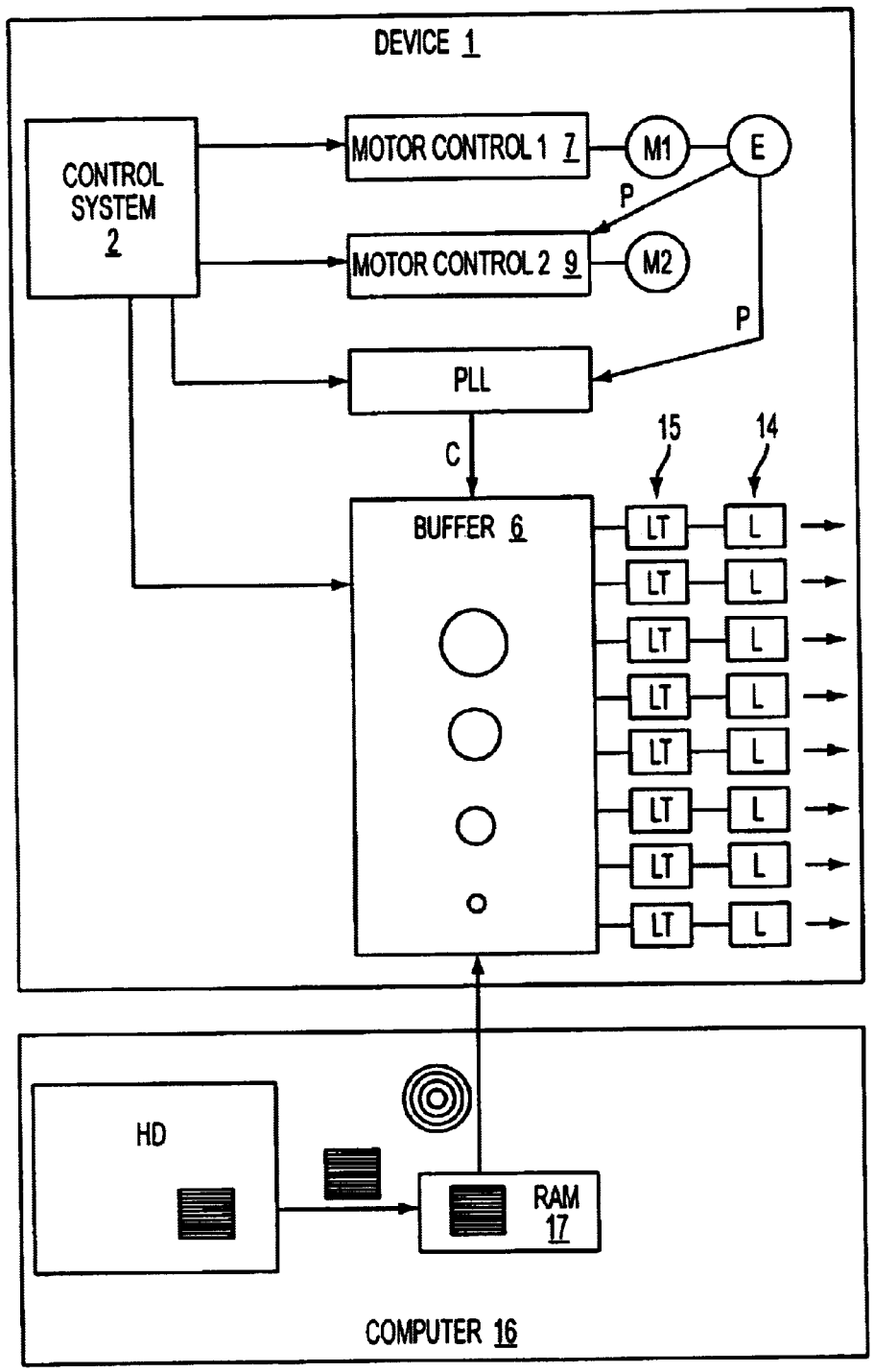

The invention is described in greater detail below with reference to the schematic figures, namely in an exemplary fashion and without limiting the scope of the invention. The figures show:

FIG. 1 a perspective representation of a first embodiment of the device;

FIG. 2 a circuit diagram of the device shown in FIG. 1, and

Figure 3:
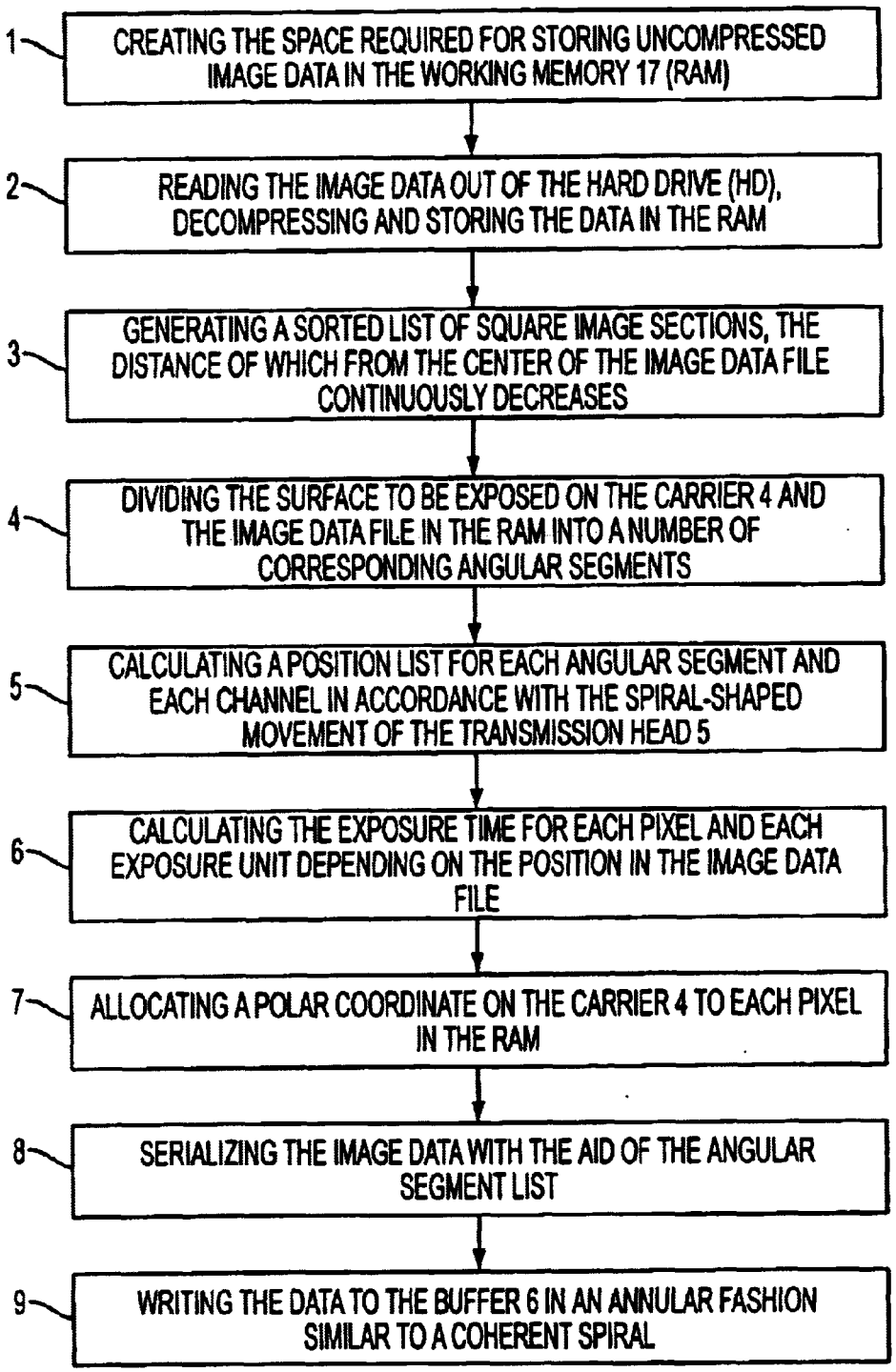

FIG. 3 a flow chart of the most important steps of the computer program according to the invention.

DETAIL DESCRIPTION OF THE PREFERRED EMBODIMENT

FIG. 1 shows a device for transmitting data to a carrier. The device 1 comprises a (not-shown) control system 2, a holding surface 3 for holding the carrier 4 and a transmission head 5 for transmitting data to this carrier 4 from a (not-shown) data memory 6. The holding surface 3 is rotatable about an X-axis 8 by means of a (not-shown) first drive 7, and the transmission head 5 is displaceable along a Y-axis 10 by means of a second drive 9. The control system 2 monitors and coordinates these movements. The holding surface 3 is essentially arranged horizontally in this case and realized in the form of a round rotary disk that rotates about the central X-axis 8. The holding surface 3 may be inclined relative to the horizontal line by a few degrees-for example, in order to simplify the installation of the carrier 4.

The first drive 7 is designed for rotating the holding surface 3 with a speed between 10 and 1000 rpm (revolutions per minute) and comprises a (not-shown) belt drive with a suitable transmission ratio.

The holding surface 3 preferably comprises a (not-shown) suction device with suction holes 11 that serve for holding the carrier 4. Additionally or alternatively, at least two relocatable centering pins 12 are preferably provided for centering the carrier 4 used relative to the X-axis 8.

The transmission head 5 preferably consists of a multi-channel transmission head and comprises a lens system 13 for exposing the light pulses of 8–32 laser diodes 14 on a carrier 4 (each laser diode corresponds to one channel). The laser diodes are controlled by means of individual drivers 15 (32 of these drivers are illustrated in FIG. 1) and preferably cooled by means of (not-shown) Peltier elements. It is particularly practical to constantly maintain a temperature of approximately 24° Celsius because an optimal state of the laser diodes with respect to the light efficiency, the wavelength constancy and the service life is achieved in this fashion within the conventional wavelength range of 830 nm. It would, in contrast to the circumstances illustrated in FIG. 1, also be possible to utilize more than 32 laser diodes 14-as long as the computer used has a corresponding capacity.

In contrast to FIG. 1, the holding surface 3 according to a second embodiment of the device is essentially arranged vertically in the device 1. This second embodiment makes it possible to simplify the installation of particularly large carriers because these carriers can, for example, be aligned relative to the centering pins while they are suspended on a suspension device and suctioned onto the holding surface 3 by means of a negative pressure before the suspension device is released. In other (not-shown) embodiments, the holding surface is arranged in any arbitrary position between a vertical and a horizontal alignment.

The device 1 comprises an additional (not-shown) computer 16, on which a computer program can be installed. This computer program comprises software code sections, by means of which data can-while this computer program is running on this additional computer 16-be read out in a circular fashion from a linear data file read into or stored in the working memory (RAM) of the computer 16, namely by generating polar coordinates, wherein the thusly determined data can be allocated to the transmission head 5 via the data memory 6 in order to be subsequently transmitted to the carrier 4.

FIG. 2 shows parts of the device 1 in the form of a highly schematic circuit diagram. These parts include the control system 2 that is directly connected (arrows) to the motor controls 1 and 2, the so-called "PLL" or "Phase Locked Loop" and the internal data memory 6 that is referred to as the buffer. The motor control 1 is connected to the first drive 7 that is referred to as the motor 1 and equipped with an encoder (E). The motor control 2 is connected to a second drive 9 that is referred to as the motor 2. The encoder (E) delivers a defined number of pulses to the motor control 2 and to the PLL per revolution of the holding surface 3. The PLL multiplies the number of pulses with an integral factor and forwards a (C=clock) pulse to the buffer with the clock rate calculated thereof. The buffer forwards a series of data to the laser drivers 15 (LT) per clock pulse. Such a data series comprises information for each laser diode (L). These laser drivers 15 set the output of the respective laser diodes (L) individually connected thereto to 1 or 0 in accordance with the data delivered by the buffer 6. A pulse rate of 5000/revolution of the holding surface 3 and a clock rate of 360,000/revolution of the holding surface 3 proved particularly practical. Both these rates may be decreased or increased in accordance with the respective requirements and significantly deviate from this described example.

FIG. 2 also shows another computer 16 that may be integrated into the control system, installed or attached into/on the device or otherwise connected to the device 1. This computer comprises a working memory 17 that is referred to as the RAM and connected to the hard drive (HD) and to the buffer (data memory 6) of the device 1. The computer program may already be installed on this computer or stored on a suitable medium, e.g., optically (e.g., on a CD) or magnetically (e.g. on a removable disk memory, a floppy disk or a similar mobile storage medium). In the latter instance, the computer program initially needs to be installed on the computer 16 such that the program means of the computer program which can be read by the computer cause the computer to monitor the execution of the following application:

loading a data file into the working memory (RAM) of the computer 16:

a linear data file that is stored on the hard drive (HD) or on a portable storage medium that can be read by the computer is conventionally read into or stored in the working memory 17 (RAM) of the computer 16.

Data is read out in a circular fashion from a linear data file read into or stored in the working memory (RAM) of the computer 16 by acquiring the data, generating polar coordinates and allocating the polar coordinates to the acquired data:

a virtual reading head or "pointer" is turned about a virtual center of the usually rectangularly arranged data file by an angle of 1/1000° in accordance with the pulse rate of 5000 and the clock rate of 360,000. It is preferred to utilize 8 or 32 virtual pointers in accordance with the number of laser diodes (L) used, wherein said pointers examine the data of the data file which are linearly arranged in a row along a "serpentine" with respect to their position and their content. The position is recorded with the aid of polar coordinates, and the content either reads 1 or 0. The acquisition of these data and positions preferably begins at the outermost periphery of the data field because the subsequent exposure preferably also begins at the outermost periphery of the carrier region to be exposed. This is the case because the displacement path of the transmission head 5 from its loading position above the control sensor 18 to the first transmission point is the shortest in this case such that practically no time is lost due to the displacement of the transmission head 5 into its initial transmitting position. Naturally, the computer requirements increase in accordance with the number of laser diodes (L) used, wherein said requirements pertain to the acquisition and conversion of the data and the compensation of the positions in accordance with each individual channel or laser diode (L) to be controlled. The computer also needs to compile these data into a number of transmittable data series.

The thusly determined data are allocated to a data memory 6 and consequently to the transmission head 5 of a device 1 for transmitting data to a carrier 4:

the data series (illustrated in the form of circles with different diameters in FIG. 2) are forwarded from the working memory 17 (RAM) of the computer 16 to the buffer 6 of the device 1 and then sent to the laser drivers 15 (LT) and the laser diodes (L)—in accordance with the clock rate. In this case, a laser diode remains in an operating state until a different instruction is received.

The data are transmitted to the points of the carrier which correspond to the allocated polar coordinates:

the holding surface 3 with the installed carrier 4 that, if so required, is held thereon with the aid of the suction generated by a vacuum system revolves about the X-axis 8, e.g., with 250 rpm. After an essentially constant rotational speed is reached, the encoder (E) connected to the motor control 1 (master) delivers, for example, 5000 pulses/revolution of the holding surface 3 to the motor control 2 (slave) and the PLL. As soon as sufficient data from the RAM 17 has arrived in the buffer 6 and the transmission head 5 has arrived at its intended starting position, the control 1 issues the command "start" to the PLL and to the buffer 6 and the exposure process begins, wherein the transmission head 5 moves along the Y-axis 10—in accordance with the pulses received from the encoder (E).

It should be quite clear that the data is, in principle, read out of the RAM 17 and transmitted to the carrier 4 in a spiral. In this case, the spacing between two-despite the spiral-nearly concentric paths is just so large that no data in the RAM 17 can be "overlooked" and no locations of the carrier 4 are exposed twice. When using a multi-channel transmission head 5, i.e., an exposure head with a lens system 13 and 8 or 32 laser diodes (L), all laser points that are collectively projected by the lens system have a position that differs from the other laser points and is taken into account in the computer calculation; this is referred to as "staggering."

This optical staggering causes that-due to the rotation of the plate 4 situated underneath-different laser diodes are continuously responsible for tracking the nearly circular path. This causes the "paths" of the individual laser diodes to constantly transform into one another such that optical banding as it is primarily known from multi-channel flatbed systems and drum systems can no longer occur.

FIG. 3 shows a flow chart of the most important steps of the computer program according to the invention which is described below:

1. Sufficient space is created in the working memory 17 (RAM) of the computer 16 such that all decompressed image data for each transmission and expose process or printing order with all corresponding data buffers are available.
2. The image data of a complete image are read out of the hard drive (HD) of the computer 16, decompressed and loaded into the working memory 17 (RAM) of the computer 16. The RAM area used for this purpose preferably is specially arranged such that a maximum processing speed of the computer 16 can be achieved: the image data are-in accordance with the lingo of computer specialists-arranged in the allocated RAM area "aligned to level 2 cache run lengths and virtual page fault boundaries."
3. An ordered or sorted list of square image data file sections is generated. These image data file sections are arranged in such a sequence such that the spacing (radius) of these image data file sections relative to the center of the image data file becomes continuously and constantly smaller. This is achieved due to the fact that the pointer or virtual reading head progresses from the periphery of the image data file to the geometric center thereof on a spiral-shaped path that practically covers the entire surface of the image data file.
4. The surface of the image data file in the RAM and the corresponding surface on the carrier 4, to which the data needs to be transmitted, are divided into a series of corresponding angular segments.

5. A list is calculated for each angular segment which contains each individual position of the individual channels in the multi-channel writing head and relates these positions to the position of the transmission head 5 in the corresponding angular segment of the carrier 4. In this case, a spiral correction is calculated-in accordance with the spiral movement carried out by the transmission head 5 relative to the carrier 4.
6. The ideal exposure time for a corresponding exposure point (pixel) on the carrier 4 is calculated for each distance (radius) of the image data file sections from the center of the image data file.
7. A corresponding polar coordinate is allocated on the carrier 4 to each image point (pixel) of the image data file stored in the RAM, namely in the sequence of the list generated in step 3.
8. The image data are serialized by utilizing the angular segment list obtained in step 5 and related to an electronic clock position in accordance with the clock pulses delivered by the PLL of the device 1 and in accordance with the current transmission channel or the current laser diode 14.
9. The data are sent to the buffer 6 of the device 1 and stored therein in the form of an uninterrupted spiral (e.g., as it is formed when skillfully peeling an apple) via a data line that is realized in the form of a LVD SCSI connection (it is also possible to utilize other connections).

The data are transmitted to the carrier 4 in the device 1 by means of the transmission head 5, namely in an uninterrupted fashion and in the form of a spiral-shaped movement. The spiral correction for the individual optical outputs of the 8 or 32 laser diodes 14 is-as described above-corrected computationally. This computer program may be configured for a single channel or for a very large number of channels, wherein the described principles essentially always remain the same.

The computer program according to the invention may also serve or be adapted for making available the data when using transmission heads with multi-arrays, e.g., 64 or more laser diodes, or when using, for example, ink jet printing heads with up to 256 nozzles or more. The general operating principle of the computer program also remains the same in this case.

When carrying out the method according to the invention, a data carrier 4—on which data need to be exposed in this case—is installed in the device 1 manually or in an automated fashion, i.e., placed onto the holding surface 3 that is realized in the form of a rotary disk. The carrier 4 that is realized in the form of an offset printing plate, a lithography film or a setting copy for flexographic printing processes and provided with conventional centering holes is correctly installed once the centering pins 12 engage into the centering holes. The carrier 4 is preferably positioned in such a way that its center point essentially coincides with the geometric point at which the X-axis 8 penetrates through the holding surface 3. The transmission head 5 that is realized in the form of an exposure head is positioned outside the holding surface 3 during this installation process, namely on the right side on which it is situated above a control sensor 18—for controlling the laser diodes. The exposure chamber of the device 1 can subsequently be closed in order to additionally reduce the risk of contaminating the data carrier 4 and to preclude any risk of injuries to the operator.

A device 1 with a control system 2, a holding surface 3 for holding the carrier 4 and a transmission head 5 for transmitting data from a data memory 6 to the carrier 4 is used for the transmission of data to a carrier 4. In this case, the holding surface 3 rotates about a X-axis 8 with the aid of a first drive 7, and the transmission head 5 is displaced along a Y-axis 10 by means of a second drive 9. The control system 2 monitors and coordinates the movements of these two drives. In order to enable to device 1 to carry out this data transmission, a computer program needs to be installed on an additional computer 16 that is connected to the device 1. The software code sections of this computer program cause the computer 16 to read out data in a circular fashion from a linear data file read into or stored in the working memory (RAM) of the computer 16, namely by generating polar coordinates, and to allocate the thusly determined data to the transmission head 5 via the data memory 6 for the subsequent transmission to the carrier 4.

The rotational speed of the holding surface 3 can essentially be maintained constant during the transmission of data to a carrier 4. Rotational speeds between 100 and 500 rpm are very practical, wherein the range between 250 and 350 rpm is particularly preferred. In this first operating mode, in which the movement of the transmission head 5 for transmitting the data begins at the outermost periphery of the carrier 4 and ends in the region of the center of rotation of the holding surface 3, the length of the laser pulses is shortened as the distance from the center of rotation of the holding surface 3 decreases—in order to compensate the different relative circumferential speeds of the points to be exposed. This causes the transmission rate to increase. In the context of this invention, the transmission rate is defined as the number of pulses/sec. Vice versa, the transmission rate can be lowered toward the periphery if the transmission of data begins essentially in the center of rotation of the holding surface 3.

Alternatively to the first operating mode, the rotational speed of the holding surface 3 preferably is essentially varied linearly during the transmission of data in a second operating mode. In this case, rotational speeds between 100 and 800 rpm are very practical, wherein a rotational speed between 250 and 450 rpm is particularly preferred. In this second operating mode, in which the movement of the transmission head 5 for transmitting the data also begins at the outermost periphery of the carrier 4 and ends in the region of the center of rotation of the holding surface 3, the transmission rate is maintained constant and the rotational speed of the holding surface 3 is increased in dependence on the distance from its center of rotation-in order to adapt the relative circumferential speed of the points to be exposed toward the center of rotation of the holding surface 3. Vice versa, the rotational speed of the holding surface 3 can be correspondingly lowered toward the periphery if the transmission of data begins essentially in the center of rotation of the holding surface 3.

When using other transmission heads, e.g., in the form of ink jet printing heads, it is also possible to print data on data carriers 4 that, for example, consist of paper, cardboard, plastic foils, textiles or even hard surfaces such as ceramic articles and the like.

The advantages attained with the device according to the invention include:

- The combination of a rotary disk 3 and a transmission head 5 that can be displaced along one axis makes it possible to realize an extremely inexpensive and simple mechanical construction, wherein the obtained results are of the highest quality.
- Due to the essentially horizontal holding surface 3, carriers 4 can be manually or even automatically installed as easily as in a flatbed system.
- Digital-optical banding is completely prevented despite this simple construction.

Dust particles generated by the exposure process are not accelerated in the direction of the lens system 13 of the transmission head 5, but essentially in the radial direction due to the centrifugal force of the carrier that rotates together with the holding surface 3.

The possibly required removal of smoke particles created during the exposure of setting copies for flexographic printing processes or of dust particles created during the exposure of thermal plates for offset printing processes can be realized with the aid of a suction device that is arranged in the vicinity of the transmission head 5, wherein the respective particles can be very easily disposed of via a suction line.

The advantages attained with the method according to the invention include:

The transmission of data takes place in the form of a continuous process such that no time-consuming start and stop movements need to be performed as it is, for example, the case with flatbed systems.

Despite the high number of formats that can be processed, it is ensured that, in contrast to exterior drum systems in which holding strips frequently cover part of the edge, all carriers 4 can be exposed up to the edge on all sides.

The movement of the transmission head 5 begins at the outermost periphery and already ends in the region of the center of rotation of the holding surface 3. This means that a minimal time is required for the exposure process and idle times that may amount to approximately ⅓ of the exposure time, e.g., in interior drum systems, are practically eliminated.

What is claimed is:

1. A computer program that is stored on a suitable storage medium and comprises program means that can be read by a computer and cause the computer (16) to monitor the execution of the following application:

loading a data file into the working memory (RAM) of the computer (16);

reading out data in a circular fashion from a linear data file read into or stored in the working memory (RAM) of the computer (16) by acquiring the data, generating polar coordinates and allocating the polar coordinates to the acquired data;

allocating the thusly determined data to a data memory (6) and consequently to a transmission head (5) of a device (1) for transmitting data to a carrier (4), wherein said device (1) comprises a control system (2), a holding surface (3) for holding the carrier (4) and a transmission head (5) for transmitting data to this carrier (4) from the data memory (6), wherein the holding surface (3) is rotatable about a X-axis (8) by means of a first drive (7) and the transmission head (5) is displaceable along a Y-axis (10) by means of a second drive (9), and wherein the movements of the holding surface and the transmission head are controlled in a coordinated fashion by the control system (2), and transmitting the data to the points of the carrier (4) which correspond to the allocated polar coordinates, wherein said program means that can be read by the computer are realized such that they cause the computer (16) to arrange the image data in the RAM area used "aligned to level 2 cache run lengths and virtual page fault boundaries" in order to achieve a maximum processing speed.

2. A computer program that is stored on a suitable storage medium and comprises program means that can be read by a computer and cause the computer (16) to monitor the execution of the following application:

loading a data file into the working memory (RAM) of the computer (16);

reading out data in a circular fashion from a linear data file read into or stored in the working memory (RAM) of the computer (16) by acquiring the data, generating polar coordinates and allocating the polar coordinates to the acquired data;

allocating the thusly determined data to a data memory (6) and consequently to a transmission head (5) of a device (1) for transmitting data to a carrier (4), wherein said device (1) comprises a control system (2), a holding surface (3) for holding the carrier (4) and a transmission head (5) for transmitting data to this carrier (4) from the data memory (6), wherein the holding surface (3) is rotatable about a X-axis (8) by means of a first drive (7) and the transmission head (5) is displaceable along a Y-axis (10) by means of a second drive (9), and wherein the movements of the holding surface and the transmission head are controlled in a coordinated fashion by the control system (2), and transmitting the data to the points of the carrier (4) which correspond to the allocated polar coordinates, wherein said program means that can be read by the computer are realized such that they cause the computer (16) to generate a list of square image data file sections, wherein these image file sections are arranged in such a sequence that the distance of the image data file sections from the center of the image data file continuously and constantly decreases.

3. A computer program that is stored on a suitable storage medium and comprises program means that can be read by a computer and cause the computer (16) to monitor the execution of the following application:

loading a data file into the working memory (RAM) of the computer (16);

reading out data in a circular fashion from a linear data file read into or stored in the working memory (RAM) of the computer (16) by acquiring the data, generating polar coordinates and allocating the polar coordinates to the acquired data;

allocating the thusly determined data to a data memory (6) and consequently to a transmission head (5) of a device (1) for transmitting data to a carrier (4), wherein said device (1) comprises a control system (2), a holding surface (3) for holding the carrier (4) and a transmission head (5) for transmitting data to this carrier (4) from the data memory (6), wherein the holding surface (3) is rotatable about a X-axis (8) by means of a first drive (7) and the transmission head (5) is displaceable along a Y-axis (10) by means of a second drive (9), wherein the transmission head comprises a multi-channel writing head and wherein the movements of the holding surface and the transmission head are controlled in a coordinated fashion by the control system (2), and transmitting the data to the points of the carrier (4) which correspond to the allocated polar coordinates, wherein said program means that can be read by the computer are realized such that they cause the computer (16) to calculate a list for each of the angular segments, into which the surface of the image data file in the RAM and the corresponding surface of the carrier 4 are divided, wherein this list contains each individual position of the individual channels in the multi-channel writing head, and wherein the computer relates these individual positions to the position of the transmission head 5 in the corresponding angular segment of the carrier 4.

4. A method for transmitting data to a carrier, wherein a device (1) is used which comprises a control system (2), a holding surface (3) for holding the carrier (4) and a transmission head (5) for transmitting data to this carrier from a data memory (6), wherein the holding surface (3) is rotatable about a X-axis (8) by means of a first drive (7) and the transmission head (5) is displaceable along a Y-axis (10) by means of a second drive (9), and wherein the movements of the holding surface and the transmission head are controlled in a coordinated fashion by the control system (2), wherein a computer program is installed on an additional computer (16) that is connected to the device, wherein software code sections of the computer program cause the computer (16) to read out data in a circular fashion from a linear data file read into or stored in the working memory (RAM) of the computer (16), namely by generating polar coordinates, and by the fact that the thusly determined data is allocated to the transmission head (5) via the data memory (6) for the subsequent transmission to the carrier (4), wherein the holding surface (3) has a rotational speed varied linearly during the transmission of data between about 100 and about 800 rpm, and wherein the movement of the transmission head (5) for transmitting the data begins at the outermost periphery of the carrier (4) and ends in the region of the center of rotation of the holding surface (3).

5. The method according to the claim 4, wherein the transmission rate is maintained constant by the fact that the rotational speed of the holding surface (3) is increased depending on the distance from its center of rotation-in order to adapt the circumferential speeds of the points to be exposed toward the center of rotation of the holding surface (3).

\* \* \* \* \*